(12) United States Patent
Lambert et al.

(10) Patent No.: US 7,973,664 B1
(45) Date of Patent: Jul. 5, 2011

(54) CLOSURE HAVING RFID AND FOIL

(75) Inventors: Phil Lambert, Newburgh, IN (US); Mark Branson, Newburgh, IN (US); William Shankland, Evansville, IN (US)

(73) Assignee: Rexam Healthcare Packaging Inc., Perrysburg, OH (US)

( * ) Notice: Subject to any disclaimer, the term of this patent is extended or adjusted under 35 U.S.C. 154(b) by 170 days.

(21) Appl. No.: 11/462,418

(22) Filed: Aug. 4, 2006

(51) Int. Cl.
*G08B 13/14* (2006.01)
*G08B 1/08* (2006.01)
*H01L 21/00* (2006.01)
*G06K 19/00* (2006.01)
*G06F 19/00* (2006.01)

(52) U.S. Cl. ............... 340/572.8; 340/572.1; 340/572.7; 340/539.1; 438/53; 235/487; 235/385

(58) Field of Classification Search ................. 340/572.8
See application file for complete search history.

(56) References Cited

U.S. PATENT DOCUMENTS

| | | |
|---|---|---|
| 1,563,731 A | 12/1925 | Ducas |
| 3,409,129 A | 11/1968 | Sperry |
| 4,497,765 A | 2/1985 | Wilde et al. |
| 4,510,490 A | 4/1985 | Anderson, III et al. |
| 4,598,276 A | 7/1986 | Tait |
| 4,601,404 A | 7/1986 | Shivers |
| 4,711,368 A | 12/1987 | Simons |
| 4,801,929 A | 1/1989 | Instance |
| 4,813,564 A | 3/1989 | Cooper et al. |
| 4,847,597 A | 7/1989 | Dobosi et al. |
| 5,566,441 A | 10/1996 | Marsh et al. |
| 5,625,347 A | 4/1997 | MacLean et al. |
| 5,678,925 A | 10/1997 | Garmaise et al. |
| 5,743,426 A | 4/1998 | Mosley |
| 5,788,099 A | 8/1998 | Treu et al. |
| 5,790,029 A | 8/1998 | Curnutte et al. |
| 5,852,590 A | 12/1998 | De la Huerga |
| 6,031,457 A | 2/2000 | Bonkowski et al. |
| 6,045,652 A | 4/2000 | Tuttle et al. |
| 6,137,413 A | 10/2000 | Ryan, Jr. |
| 6,239,712 B1 | 5/2001 | Hawk |
| 6,259,654 B1 | 7/2001 | De la Huerga |
| 6,271,753 B1 | 8/2001 | Shukla |
| RE37,406 E | 10/2001 | Behrmann et al. |
| 6,353,391 B1 | 3/2002 | Shearer |
| 6,366,260 B1 | 4/2002 | Carrender |
| 6,418,283 B1 | 7/2002 | Wegman et al. |
| 6,424,315 B1 | 7/2002 | Glenn et al. |
| 6,501,382 B1 | 12/2002 | Rehfus et al. |
| 6,504,481 B2 | 1/2003 | Teller |
| 6,529,446 B1 | 3/2003 | De la Huerga |

(Continued)

*Primary Examiner* — George A Bugg
*Assistant Examiner* — Jack Wang
(74) *Attorney, Agent, or Firm* — Chad D. Bruggeman; John F. Salazar; Middleton Reutlinger

(57) ABSTRACT

A closure comprising a top wall with an annular side wall depending there from. An induction foil is proximate an inner surface of the top wall and may have a ring or circular configuration. An RFID device is affixed or is integral with the closure a minimum distance from and/or orientation with the induction foil as to prevent damage to the RFID device during an induction sealing process and to reduce adverse operational effects of the RFID from the foil. The RFID may be active or passive and may be proximate or integral with the top wall or integral with the side wall of the closure. The RFID may be contained within a film wherein a portion of the film is inductively sealed to the closure.

9 Claims, 4 Drawing Sheets

U.S. PATENT DOCUMENTS

| | | | |
|---|---|---|---|
| 6,592,043 B1 | 7/2003 | Britton | |
| 6,641,052 B2 | 11/2003 | Baillod et al. | |
| 6,646,328 B2 | 11/2003 | Tsai | |
| 6,707,763 B2 | 3/2004 | Osberg et al. | |
| 6,782,601 B2 * | 8/2004 | Smeyak et al. | 29/601 |
| 6,831,552 B2 | 12/2004 | Lin | |
| 6,845,064 B2 | 1/2005 | Hildebrandt | |
| 6,879,876 B2 | 4/2005 | O'Dougherty et al. | |
| 6,897,827 B2 | 5/2005 | Senba et al. | |
| 6,982,640 B2 | 1/2006 | Lindsay et al. | |
| 6,992,586 B2 | 1/2006 | Rosenfeld | |
| 7,070,053 B1 | 7/2006 | Abrams et al. | |
| 7,088,249 B2 | 8/2006 | Senba et al. | |
| 7,116,356 B2 * | 10/2006 | Peeples | 348/207.99 |
| 7,327,266 B2 * | 2/2008 | Watanabe et al. | 340/572.8 |
| 7,364,089 B2 | 4/2008 | Claessens et al. | |
| 2001/0028308 A1 | 10/2001 | De La Huerga | |
| 2002/0185544 A1 | 12/2002 | Baillod et al. | |
| 2002/0189667 A1 | 12/2002 | O'Dougherty et al. | |
| 2003/0004608 A1 | 1/2003 | O'Dougherty et al. | |
| 2003/0020613 A1 | 1/2003 | Cosnard | |
| 2003/0043039 A1 * | 3/2003 | Salemi et al. | 340/572.8 |
| 2003/0058110 A1 | 3/2003 | Rich | |
| 2003/0061705 A1 | 4/2003 | Smeyak et al. | |
| 2003/0061706 A1 | 4/2003 | Smeyak et al. | |
| 2003/0071725 A1 | 4/2003 | Teller | |
| 2003/0099158 A1 | 5/2003 | De la Huerga | |
| 2003/0235027 A1 * | 12/2003 | Smeyak et al. | 361/679 |
| 2004/0008123 A1 | 1/2004 | Carrender et al. | |
| 2004/0032330 A1 | 2/2004 | Hoffman | |
| 2004/0046020 A1 | 3/2004 | Andreasson et al. | |
| 2004/0069850 A1 | 4/2004 | De Wilde | |
| 2004/0070504 A1 | 4/2004 | Brollier et al. | |
| 2004/0074974 A1 | 4/2004 | Senba et al. | |
| 2005/0051624 A1 | 3/2005 | Kipp et al. | |
| 2005/0110647 A1 * | 5/2005 | Ritson | 340/686.1 |
| 2005/0128087 A1 * | 6/2005 | Claessens et al. | 340/572.8 |
| 2005/0224445 A1 | 10/2005 | Gancia | |
| 2006/0049948 A1 * | 3/2006 | Chen et al. | 340/572.7 |
| 2006/0092013 A1 * | 5/2006 | Hager et al. | 340/539.1 |
| 2006/0180650 A1 | 8/2006 | Claessens et al. | |
| 2007/0182563 A1 * | 8/2007 | Abbott | 340/572.8 |
| 2007/0182564 A1 * | 8/2007 | Abbott | 340/572.8 |
| 2007/0267383 A1 * | 11/2007 | McGeough et al. | 215/273 |
| 2007/0289934 A1 * | 12/2007 | Gancia | 215/201 |
| 2009/0066518 A1 * | 3/2009 | Tanaka et al. | 340/572.8 |

* cited by examiner

CLOSURE HAVING RFID AND FOIL

CROSS-REFERENCE TO RELATED APPLICATIONS

Not applicable.

STATEMENT REGARDING FEDERALLY SPONSORED RESEARCH OR DEVELOPMENT

Not applicable.

FIELD OF INVENTION

The present invention generally relates to packaging having a radio frequency identification (RFID) therein for relaying information regarding the packaging and/or contents thereof. More specifically, the present invention relates to closures for containers having an RFID.

BACKGROUND OF THE INVENTION

The development of integrated circuitry, particularly RFIDs, has permitted use of such devices in a wide range of applications. RFIDs first appeared in tracking and access applications during the 1980s. These wireless systems allow for non-contact reading and are effective in manufacturing and other hostile environments where bar code labels could not survive. RFID has established itself in a wide range of markets including livestock identification and automated sorting systems because of its ability to track moving objects. They can be operated passively or actively. While both use radio frequency energy to communicate between a tag and a reader, the method of powering the tags is different. Active RFIDs use an internal power source (battery) within an RFID tag to continuously power the RFID, whereas passive RFIDs rely on energy transferred from the reader to the RFID tag to power the RFID.

Recently, RFIDs have been used in a product packaging such as containers and closures. The utilization of an RFID with a closure and container combination has a wide variety of applications, including identification of contents, product promotions, storage and dissemination of product information including product processing, quality assurance, including tamper-indication. However, a problem existing with many applications of RFIDs in closures is that the RFID can be damaged during the production of a closure having an RFID or when sealing the closure having the RFID to a container. Other problems have been found with the performance of the RFID when metals are incorporated into a closure or closure and container combination.

Induction sealing is a process often employed in assembling a closure or in sealing a closure to a container neck. Often times a film or sealing disc is used to seal in a container contents. This has been accomplished by putting an induction foil adjacent an inner surface of a top wall of a closure and a sealing disc adjacent the lower side of the induction foil. The induction foil is typically comprised of a nonferrous metal such as copper, steel, gold, and aluminum. A magnetic field is established by a radio frequency coil about the closure which induces a current in the metal induction foil. As the current flows through the metal induction foil, the resistivity of the induction foil generates heat which partially melts the thermoplastic materials which are adjacent thereto, typically a portion or component part of the closure, container, or both resulting in chemical bonding of the adjacent thermoplastics.

Problems have been encountered with use of RFIDs with containers and closures having induction foil incorporated therein. The heat generated during the induction process can render an RFID device inoperable thus restricting or even prohibiting the use of an RFID device when using an induction sealing process with a closure or closure and container combination. Additionally, radio waves bounce off metal causing interference from the metal disrupting the RFID signal. Moreover, metal causes eddy currents in the vicinity of the RFID reader antennae which absorb RF energy, thus reducing the overall effectiveness of the RFID field. These eddy currents also create their own magnetic field perpendicular to the metal surface which can cancel the reader field. Furthermore, metal can also detune both reader and tag antenna, causing added parasitic capacitance reducing system performance. Finally, at some frequencies the energy reflected by metal creates interference between the tag and reader. Therefore, having an RFID in a metal environment can cause reductions in actual read and write rates, ranges and reliabilities.

SUMMARY OF THE INVENTION

According to the present invention a closure having an RFID and induction foil for induction heat sealing at least one component part of the closure and/or the closure to a container wherein the induction foil is of a metallic material and the sealing is brought about through the inducement of a magnetic field in the metallic induction foil by a radio frequency coil. The closure with the RFID and induction foil is exposed to a radio frequency current causing a magnetic field to be induced in the induction foil which causes the temperature of the foil to increase which melts thermoplastic material proximate the induction foil to a softened or melted state and thus brings about adhesion or bonding between the proximate thermoplastic materials and foil.

BRIEF DESCRIPTION OF THE DRAWINGS

Reference to the figures discloses several embodiments of the present invention and is not to be interpreted as limiting the scope of the present invention.

DETAILED DESCRIPTION OF THE PREFERRED EMBODIMENTS

The following detailed description is given primarily for clearness of understanding and no unnecessary limitations are to be understood there from and modifications will become obvious to those skilled in the art upon reading the disclosure and may be made without departing from the spirit of the invention and scope of the appended claims.

Figure 1:
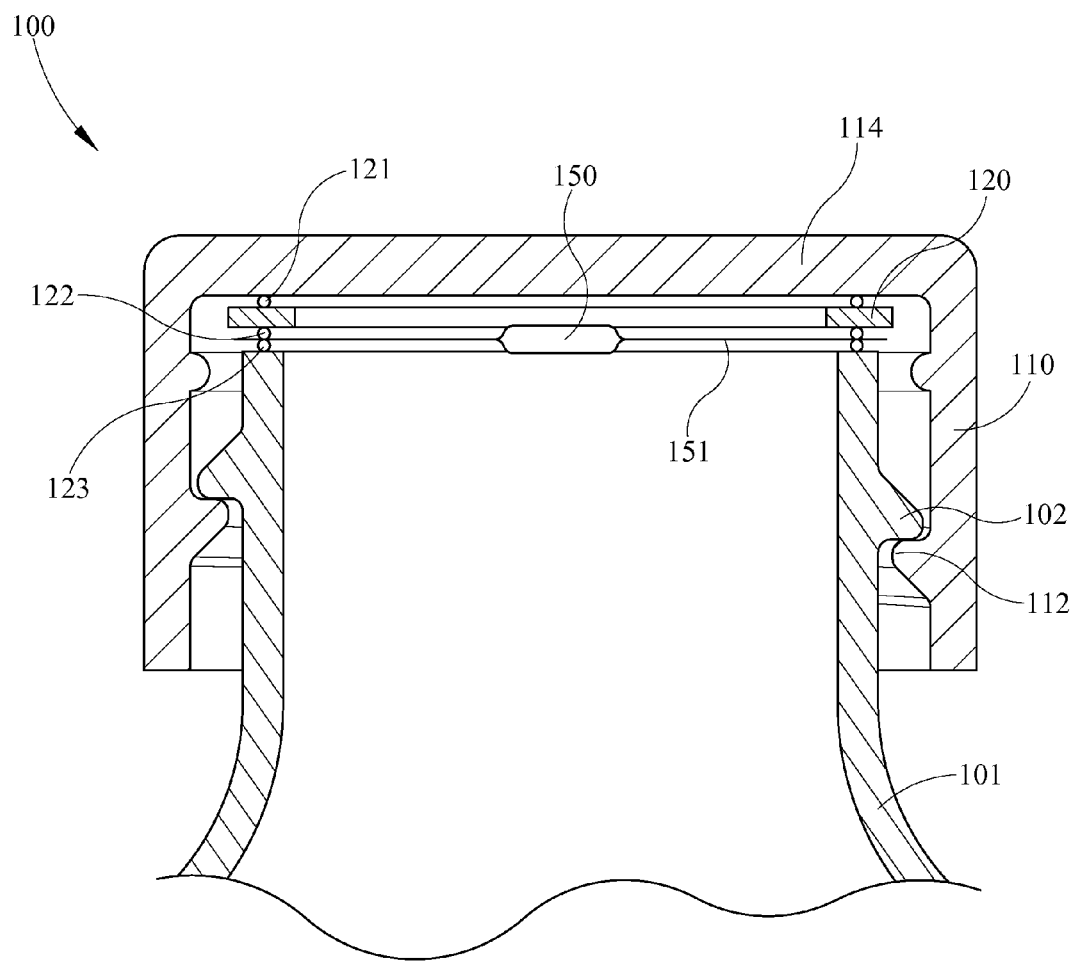
FIG. 1 is a cross-sectional view of a closure and container combination wherein the closure is a threaded closure having an RFID disposed proximate a top wall within a film inductively sealed to the closure and a container.

FIG. 1 shows closure 100 and container 101 wherein closure 100 has RFID 150 contained within film 151. Closure 100 is a screw type closure having top wall 114 with annular depending side wall 110. Side wall 110 has helical thread 112 depending from an inner annular surface thereof for engaging helical thread 102 on the neck of container 101. RFID 150 is disposed proximate top wall 114 within film 151 which is inductively sealed to closure 100 and container 101. Top wall 114 has annular side wall 110 depending there from. Induction foil 120 is circular with a hollow center or a ring configuration and is adjacent an inner surface of top wall 114. RFID device 150 is affixed to closure top wall 114 at a minimum distance from and orientation with induction foil 120 as to prevent damage to RFID device 150 during an induction sealing process and to reduce adverse effects of the RFID due to the foil. Preferably, the distance between RFID 150 and induction foil 120 is at least 0.2 inches. RFID 150 is retained centrally within film 151 wherein film 151 has a circular configuration. In this embodiment the axial configuration of induction foil 120 is in a ring configuration proportional to the upper edge of the neck of container 101 and is adjacent top wall 114. Induction film 151 has a diameter proportional to the outer diameter of induction foil 120 and has an outer edge portion adjacent thereto and to the upper edge of the neck of container 101. Exposing container 101 and closure assembly 100 to a magnetic field generated by a radio frequency coil induces a current in metal induction foil 120 heating foil 120 to a temperature in excess of a melting point of the materials comprising closure top wall 114, film 151, and the upper edge of the neck of container 101. Preferably, closure top wall 114, film 151, and the upper edge of the neck of container 101 are comprised of polymeric or thermoplastic materials. The heat generated within induction foil 120 melts a portion of closure top wall 114, film 151, and an upper edge of the neck of container 101 and upon cooling forms weld points 121, 122, and 123 respectively. Preferably, welds 121 and 122 are stronger than weld 123 wherein a rotational force placed on closure 100 removing it from container 101 breaks weld 123. In this configuration, RFID 150 stays proximate top wall 114 with film 151 being adjacent induction foil 120 when closure 100 is removed from container 101.

RFID 150 may be an active or passive RFID. RFID 150 typically contains at least content identification information but may also have sensors and data read therefrom such as temperature, shock, tamper-indication, product quality assurance, and may also have additional information such as product promotions or any variety of information that may be deemed appropriate. Induction foil 120 has at least one non-ferrous metal such as copper, steel, gold, and aluminum, and preferably has aluminum.

Figure 2:
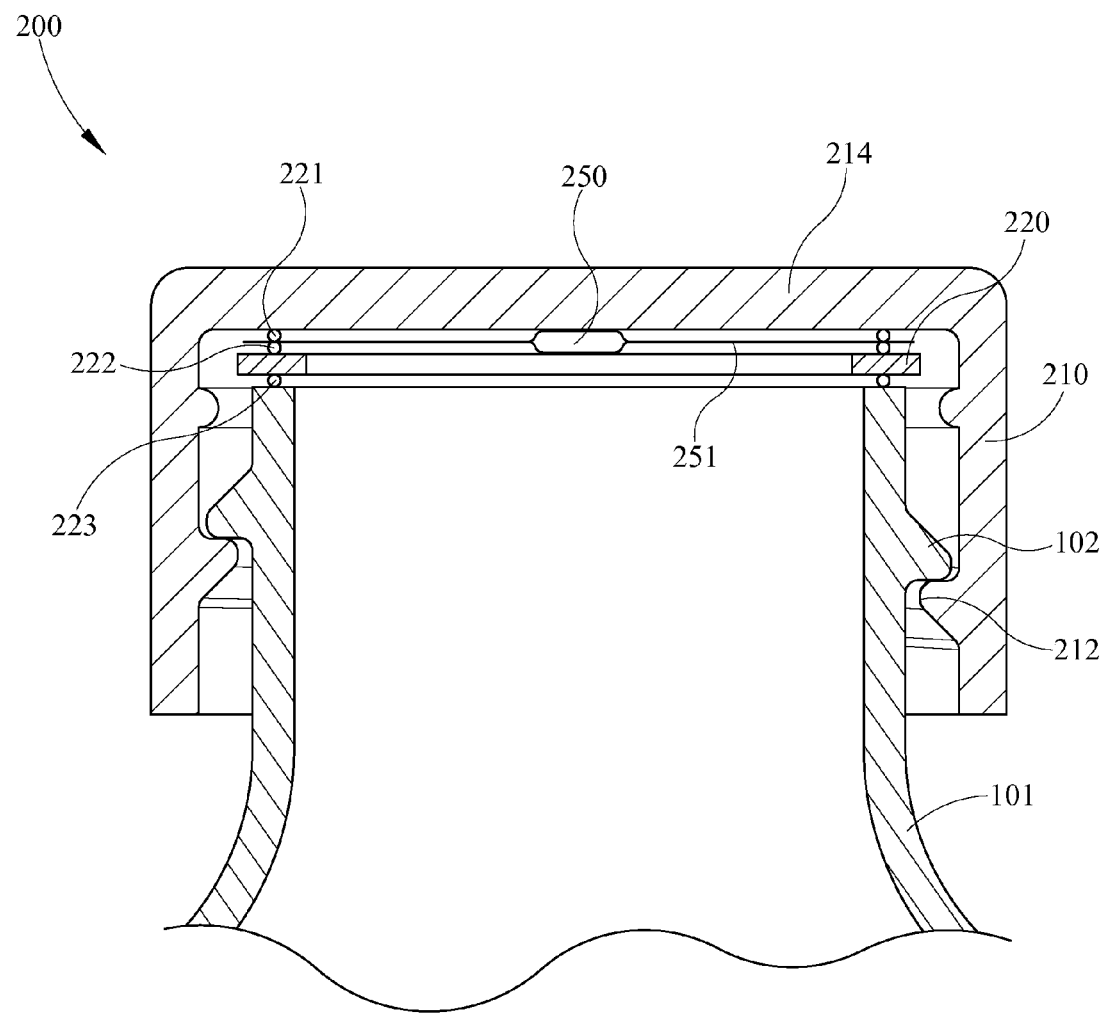
FIG. 2 is a cross-sectional view of a closure and container combination wherein the closure is a threaded closure having an RFID disposed adjacent a top wall within a film inductively sealed to the closure and the closure is inductively sealed to a container.

FIG. 2 shows closure 200 and container 101 wherein closure 200 has RFID 250 contained within film 251. Closure 200 has RFID 250 disposed adjacent top wall 214 within film 251 inductively sealed thereto. Closure 200 is a screw type closure having top wall 214 with annular depending side wall 210. Side wall 210 has helical thread 212 depending from an inner annular surface thereof for engaging helical thread 102 on the neck of container 101. RFID 250 is disposed adjacent top wall 214 within film 251 which is inductively sealed to closure 200 and induction foil 220. Induction foil 220 has a ring configuration and is proximate an inner surface of top wall 214 and adjacent an outer portion of film 251. RFID device 250 is affixed to closure top wall 214 at a minimum distance from and orientation with induction foil 220 as to prevent damage to RFID device 250 during an induction sealing process and reduce adverse performance effects on RFID 250. Preferably, the distance between RFID 250 and induction foil 220 is at least 0.2 inches and advantageously RFID 250 is symmetrically oriented with respect to foil 220. RFID 250 is retained centrally within film 251 wherein film 251 has a circular configuration. In this embodiment the axial configuration of induction foil 220 is a ring proportional to the upper edge of the neck of container 101 and is adjacent an outer portion of film 251. Induction film 251 has a diameter proportional to the outer diameter of induction foil 220 and has an outer edge portion adjacent thereto. Exposing container 101 and closure assembly 200 to a magnetic field generated by a radio frequency coil induces a current in metal induction foil 220 heating foil 220 to a temperature in excess of a melting point of the materials comprising closure top wall 214, film 251, and the upper edge of the neck of container 101. Preferably, closure 200, film 251, and the upper edge of the neck of container 101 are comprised of polymeric or thermoplastic materials. The heat generated within induction foil 220 melts a portion of closure top wall 214, film 251, and an upper edge of the neck of container 101 and upon cooling forms weld points 221, 222, and 223 respectively. Preferably, welds 221 and 222 are stronger than weld 223 wherein a rotational force placed on closure 200 removing it from container 101 breaks weld 223. In this configuration, RFID 250 stays adjacent top wall 214 within film 251 and induction foil 220 when closure 200 is removed from container 101.

Figure 3:
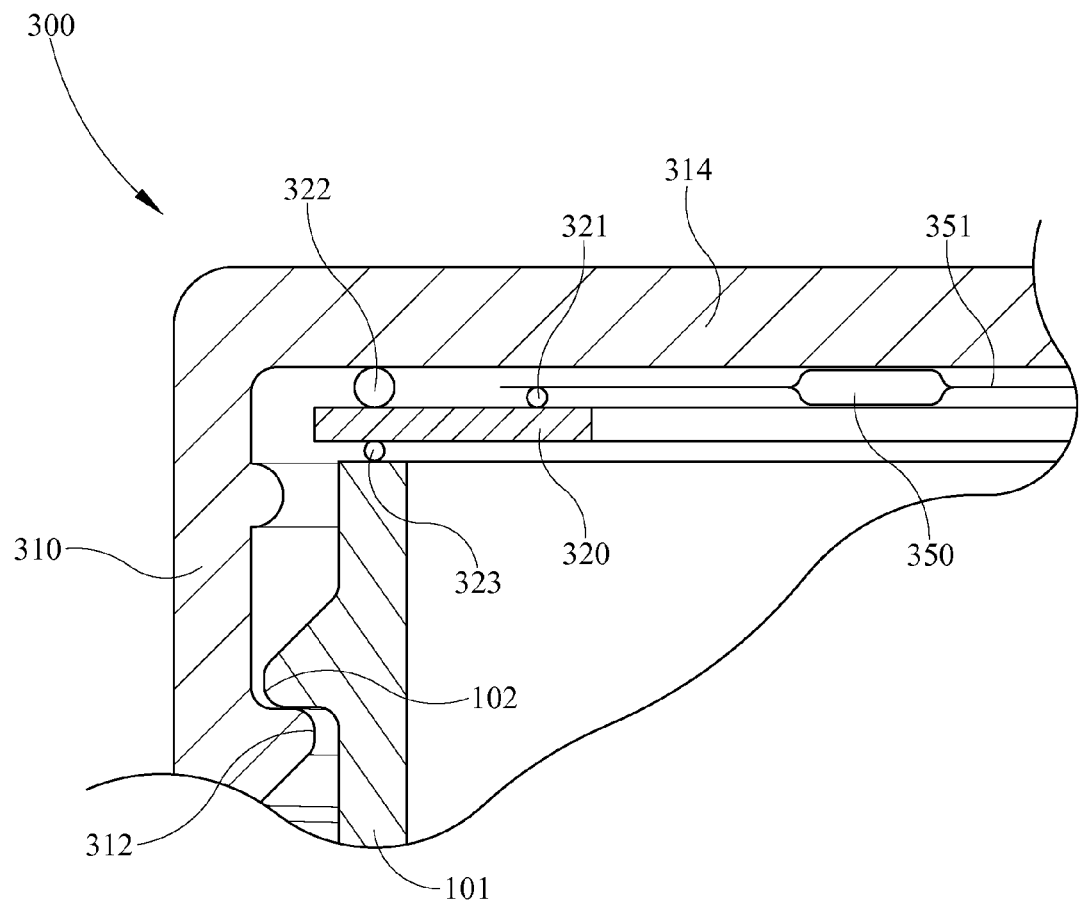
FIG. 3 is a cross-sectional view of a closure and container combination wherein the closure is a threaded closure having an RFID disposed adjacent a top wall within a film inductively sealed to the closure and a container.

FIG. 3 shows closure 300 and container neck 101 wherein closure 300 is a threaded closure having RFID 350 disposed proximate top wall 314 within film 351 inductively sealed thereto. Closure 300 is a screw type closure having top wall 314 with annular depending side wall 310. Side wall 310 has helical thread 312 depending from an inner annular surface thereof for engaging helical thread 102 on container neck 101. RFID 350 is disposed adjacent top wall 314 within film 351 which is inductively sealed to top wall 314. Induction foil 320 has a ring configuration and has an outer portion adjacent an inner surface of top wall 314 and an inner portion adjacent an outer portion of film 351. An outer portion of the lower side of induction foil 320 is placed adjacent an upper edge container neck 101. RFID device 350 is affixed adjacent closure top wall 314 at a minimum distance from and orientation with induction foil 320 as to prevent damage to RFID device 350 during an induction sealing process and to reduce adverse operational effects on RFID 350 from foil 320. Preferably, the distance between RFID 350 and induction foil 320 is at least 0.2 inches. RFID 350 is retained centrally within film 351 wherein film 351 has a circular configuration. In this embodiment the axial configuration of induction foil 320 is in a ring configuration having an outer diameter proportional to the upper edge of the neck of container 101 and has an inner diameter less than an inner diameter of container neck 101 thus induction foil 320 extends axially inward toward a central vertical axis of closure 300 more than the top edge of container neck 101. Induction film 351 has a diameter less than the inner diameter of container neck 101 and greater than an inner diameter of induction foil 320 and has a top adjacent top wall 314 and a bottom surface having an outer edge portion adjacent to an upper inner edge portion of induction foil 320. Exposing container neck 101 and closure 300 assembly to a magnetic field generated by a radio frequency coil induces a current in metal induction foil 320 heating foil 320 to a temperature in excess of a melting point of the materials comprising closure 300, film 351, and the upper edge of container neck 101. Preferably, top wall 314, film 351, and the upper edge of container neck 101 are comprised of polymeric or thermoplastic materials. The heat generated within induction foil 320 melts a portion of closure top wall 314, film 351, and an upper edge of container neck 101 and upon cooling forms weld points 322, 321, and 323 respectively. Preferably, weld 322 is stronger than weld 323 wherein a rotational force placed on closure 300 removing it from container neck 101 breaks weld 323. In this configuration, RFID 350 stays adjacent top wall 314 within film 351 and induction foil 320 stays adjacent top wall 314 when closure 300 is removed from container neck 101.

Figure 4:
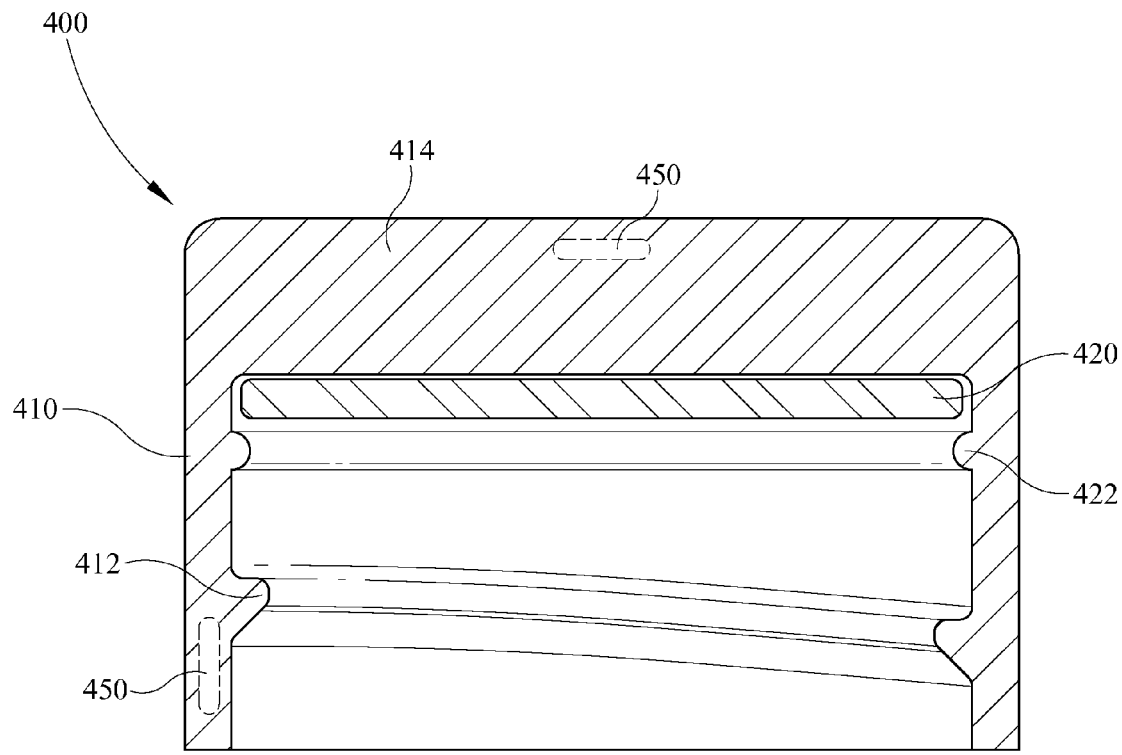
FIG. 4 is a cross-sectional view of a closure having an RFID integral with the closure a minimum distance from an induction foil.

FIG. 4 shows closure 400 having RFID 450 integral with closure 400. Closure 400 has top wall 414 with depending annular sidewall 410. Annular side wall 410 has inwardly depending helical thread 412. Adjacent an inner surface of top wall 414 is induction foil 420 which bonds to upper wall 414 and an upper edge of a container neck when closure 400 is tightened onto a container and exposed to a magnetic field generated by a radio frequency coil which induces a current in metal induction foil 420 heating foil 420 to a temperature in excess of a melting point of the materials comprising the upper edge of a container neck. An induction seal is formed between closure 400 and the container. A removing rotational force placed on closure 400 breaks the seal formed between closure 400 and a container and optional seal retaining bead 422 aids in holding induction foil 420 adjacent top wall 414. RFID 450 is integral with closure 400 a minimum distance, advantageously at least 0.2 inches, from induction foil 420 so that heat generated during the induction sealing process does not damage RFID 450. Additionally, this distance reduces adverse operational effects on RFID 450 from foil 420. In this embodiment, RFID 450 is shown integral with top wall 414 or side wall 410. In this embodiment, induction foil 420 has a circular configuration. When RFID 450 is within top wall 414, top wall 414 has a thickness of at least 0.2 inches.

The present invention is of a closure having an RFID and induction foil. The foregoing detailed description is given primarily for clearness of understanding and no unnecessary limitations are to be understood therefrom and modifications will become obvious to those skilled in the art upon reading the disclosure and may be made without departing from the spirit of the invention and scope of the appended claims. The figures show several embodiments of a closure having an induction foil and RFID. A distance between and optionally orientation with an RFID and induction foil enables an RFID to be used with an inductively sealed closure. This is not to be considered an exhaustive list of closures having an induction foil and RFID as other closures are considered to be within the scope of the present invention.

The invention claimed is:

1. A closure for use in an induction sealing process comprising:
   a closure having a top wall;
   an annular side wall depending from said top wall of said closure;
   an induction sealing disc including an annular induction foil and a substantially circular sealing film combining to sealingly engage an opening of a container neck;
   said annular induction foil proximate an inner surface of said top wall of said closure;
   said substantially circular sealing film having an RFID device embedded therein, wherein said RFID device is centrally secured relative to each of said sealing film and said annular induction foil of said induction sealing disc, wherein said RFID device is positioned at a minimum distance of at least 0.2 inches from the interior radius of said annular induction foil so as to prevent damage to said RFID device during an induction sealing process and to reduce adverse operational effects of said RFID device from being too close to said annular induction foil after said induction sealing process; and
   wherein said adverse operational effects include at least interference from being too close to said annular induction foil.

2. The closure of claim 1 wherein said sealing film has an outer edge portion adjacent said annular induction foil.

3. The closure of claim 2 wherein said outer edge portion of said sealing film is adjacent the interior radius of said annular induction foil whereby said RFID device is at least 0.2 inches away from said outer edge portion of said sealing film.

4. The closure of claim 2 wherein said annular induction foil having a top side and a bottom side, said top side of said annular induction foil secured against said inner surface of said closure top wall and said bottom side of said annular induction foil secured against said outer edge portion of said sealing film.

5. The closure of claim 2 wherein said annular induction foil having a top side and a bottom side, said top side secured against said outer edge portion of said sealing film and said bottom side secured against a rim surrounding the opening of the container neck, said sealing film secured against said inner surface of said top wall.

6. The closure of claim 2 wherein said annular induction foil having a top side and a bottom side, said top side secured directly to each of said outer edge portion of said sealing film and said inner surface of said top wall and said bottom side secured against a rim surrounding the opening of the container neck.

7. A closure comprising:
   an induction sealing disc including a metallic annular induction foil and a film combining to sealingly engage an opening of a container neck;
   said metallic annular induction foil having an inner radius; and
   said film having a substantially circular configuration, said film containing an RFID fully embedded therein proximate the center of said film, wherein said RFID is spaced at a predefined distance from said inner radius of said annular induction foil, wherein said predefined distance is at least 0.2 inches so as to reduce reduction in performance of said RFID as a result of an induction sealing process and to reduce adverse interference of said RFID during operation from being too close to said annular induction foil.

8. The closure of claim 7 wherein said film is positioned below said metallic layer within said induction sealing disc.

9. The closure of claim 7 wherein said film is positioned on top of said metallic layer within said induction sealing disc.

* * * * *

UNITED STATES PATENT AND TRADEMARK OFFICE
CERTIFICATE OF CORRECTION

| | | |
|---|---|---|
| PATENT NO. | : 7,973,664 B1 | Page 1 of 1 |
| APPLICATION NO. | : 11/462418 | |
| DATED | : July 5, 2011 | |
| INVENTOR(S) | : Lambert et al. | |

It is certified that error appears in the above-identified patent and that said Letters Patent is hereby corrected as shown below:

Column 4, Line 41: insert --of-- after "edge"

Signed and Sealed this
Tenth Day of April, 2012

David J. Kappos
*Director of the United States Patent and Trademark Office*